(12) United States Patent
Chen et al.

(10) Patent No.: US 10,090,571 B2
(45) Date of Patent: Oct. 2, 2018

(54) TRANSMISSION SWITCH CONTAINING TUNABLE DIELECTRICS AND OPERATING METHOD FOR THE SAME

(71) Applicant: MICROELECTRONICS TECHNOLOGY, INC., Hsinchu (TW)

(72) Inventors: Chang-Chun Chen, Hsinchu (TW); Chia-Yu Chou, Hsinchu (TW)

(73) Assignee: MICROELECTRONICS TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 15/332,780

(22) Filed: Oct. 24, 2016

(65) Prior Publication Data

US 2018/0115032 A1 Apr. 26, 2018

(51) Int. Cl.
*H01P 1/10* (2006.01)
*H03H 7/38* (2006.01)
*H01P 3/16* (2006.01)

(52) U.S. Cl.
CPC ............... *H01P 1/10* (2013.01); *H01P 3/165* (2013.01); *H03H 7/38* (2013.01)

(58) Field of Classification Search
CPC .. H01J 23/24; H01P 1/182; H01P 3/12; H01P 3/16; H03H 7/20; H01Q 9/145; H01Q 9/26
USPC ........ 333/157, 164, 239, 250; 343/745, 803, 343/806, 700 MS
See application file for complete search history.

(56) References Cited

U.S. PATENT DOCUMENTS

| | | | | |
|---|---|---|---|---|
| 4,636,757 A | * | 1/1987 | Harrison | ................ H03B 19/18 333/21 R |
| 6,727,535 B1 | * | 4/2004 | Sengupta | ................ H01G 7/06 257/295 |
| 6,864,840 B2 | | 3/2005 | Zhu et al. | |
| 6,972,727 B1 | * | 12/2005 | West | ...................... H01P 1/181 333/157 |
| 7,109,818 B2 | * | 9/2006 | Rivkina | .................. H01P 1/181 257/295 |

(Continued)

FOREIGN PATENT DOCUMENTS

TW 548874 8/2003

OTHER PUBLICATIONS

Office Action and Search Report dated Jun. 12, 2018 from the Taiwan counterpart application 105141587.

(Continued)

*Primary Examiner* — Dean Takaoka
(74) *Attorney, Agent, or Firm* — WPAT, P.C., Intellectual Property Attorneys; Anthony King

(57) ABSTRACT

A transmission switch includes a dielectric substrate; a conductive ground layer disposed over an upper surface of the dielectric substrate, wherein the conductive ground layer comprises a first ground section and a second ground section separated from the first ground section; a tunable dielectric layer disposed over the conductive ground layer, wherein the tunable dielectric layer has a first dielectric constant at a first DC voltage and a second dielectric constant at a second DC voltage; and a conductive signal layer disposed over the tunable dielectric layer, wherein the conductive signal layer comprises a first signal section, a second signal section, and an impedance-matching section connecting the first signal section and the second signal section.

15 Claims, 9 Drawing Sheets

(56) References Cited

U.S. PATENT DOCUMENTS

| | | | | |
|---|---|---|---|---|
| 7,375,694 | B2* | 5/2008 | Jung | H01Q 1/243 |
| | | | | 343/700 MS |
| 8,648,676 | B2* | 2/2014 | Abhari | H01P 1/184 |
| | | | | 333/209 |
| 9,000,866 | B2* | 4/2015 | Subramanyam | H01P 1/15 |
| | | | | 257/601 |
| 2006/0152304 | A1* | 7/2006 | Liang | H01P 1/2039 |
| | | | | 333/176 |
| 2010/0096678 | A1* | 4/2010 | Subramanyam | H01P 1/10 |
| | | | | 257/295 |
| 2018/0108970 | A1* | 4/2018 | Huang Chen | H01P 3/12 |

OTHER PUBLICATIONS

English abstract translation of the Office Action dated Jun. 12, 2018 from the Taiwan counterpart application 105141587.
English abstract translation of TW 548874.

* cited by examiner

TRANSMISSION SWITCH CONTAINING TUNABLE DIELECTRICS AND OPERATING METHOD FOR THE SAME

TECHNICAL FIELD

The present disclosure relates to a transmission switch and an operating method for the same, and more particularly to a transmission switch containing tunable dielectrics for transmitting signals and an operating method for the same.

DISCUSSION OF THE BACKGROUND

Electrical devices for switching from one transmission line to another are extensively used in high frequency transmission systems.

In the transmission of high frequency electrical signals from signal input ports to signal output ports, it is frequently necessary to selectively connect and disconnect the signal input terminal with the signal output terminal. As is known in the art, a radio frequency (RF) switch is a device used to connect and disconnect RF signal paths in an electrical circuit. When connecting RF signal paths, a switch generally provides a bi-directional RF signal path. Thus, signals fed to an input terminal of the switch appear at an output terminal of the switch and vice-versa.

When an RF switch provides an RF signal path having a relatively low insertion loss characteristic between two ports, the switch is generally referred to as being in the "ON" state between the two ports. When the switch provides an RF signal path having a relatively high insertion loss characteristic between the two ports, the switch is generally referred to as being in the "OFF" state between the two ports.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a transmission switch containing tunable dielectrics for transmitting signals and an operating method for the same.

In some embodiments of the present disclosure, a transmission switch comprises a dielectric substrate; a conductive ground layer disposed over an upper surface of the dielectric substrate, wherein the conductive ground layer comprises a first ground section and a second ground section separated from the first ground section; a tunable dielectric layer disposed over the conductive ground layer, wherein the tunable dielectric layer has a first dielectric constant at a first DC voltage and a second dielectric constant at a second DC voltage; and a conductive signal layer disposed over the tunable dielectric layer, wherein the conductive signal layer comprises a first signal section, a second signal section, and an impedance-matching section connecting the first signal section and the second signal section.

In some embodiments of the present disclosure, the transmission switch further comprises a bottom conductive layer disposed on a bottom surface of the dielectric substrate.

In some embodiments of the present disclosure, the transmission switch further comprises a voltage-applying device configured to apply a DC voltage to the tunable dielectric layer so as to control the dielectric constant of the tunable dielectric layer.

In some embodiments of the present disclosure, the voltage-applying device is configured to apply the DC voltage to the tunable dielectric layer through the conductive ground layer and the conductive signal layer.

In some embodiments of the present disclosure, the first ground section, the tunable dielectric layer, and the first signal section form a first resonant section; and the second ground section, the tunable dielectric layer, and the second signal section form a second resonant section.

In some embodiments of the present disclosure, the first signal section and the second signal section are conductive lines having an effective electrical length substantially equal to an integral number of half wavelengths at an operating frequency, and the transmission switch is at a turn-off state at the operating frequency.

In some embodiments of the present disclosure, the first signal section and the second signal section are conductive lines having an effective electrical length substantially equal to an odd integral number of quarter wavelengths at an operating frequency, and the transmission switch is at a turn-off state at the operating frequency.

In some embodiments of the present disclosure, the transmission switch further comprises a first conductive via electrically connecting the first signal section to the first ground section, and a second conductive via electrically connecting the second signal section to the second ground section.

In some embodiments of the present disclosure, the first signal section and the second signal section are conductive lines having an effective electrical length substantially equal to an odd integral number of quarter wavelengths at an operating frequency, and the transmission switch is at a turn-on state at the operating frequency.

In some embodiments of the present disclosure, an operating method of a transmission switch comprises a conductive ground layer, a conductive signal layer, and a tunable dielectric layer between the conductive ground layer and the conductive signal layer; wherein the operating method comprises changing an applied DC voltage to the tunable dielectric layer to alter a transmission property of the transmission switch.

In some embodiments of the present disclosure, changing an applied DC voltage to the tunable dielectric layer is performed through the conductive ground layer and the conductive signal layer.

In some embodiments of the present disclosure, changing an applied DC voltage to the tunable dielectric layer alters a dielectric constant of the tunable dielectric layer.

In some embodiments of the present disclosure, the transmission switch comprises a first resonant section, a second resonant section, and an impedance-matching section connecting the first resonant section and the second resonant section; and changing an applied DC voltage to the tunable dielectric layer alters a first impedance of the first resonant section and a second impedance of the second resonant section.

In some embodiments of the present disclosure, the first resonant section and the second resonant section serve as open circuits at an operating frequency; and changing an applied DC voltage to the tunable dielectric layer turns off the transmission switch.

In some embodiments of the present disclosure, the first resonant section and the second resonant section serve as short circuits at an operating frequency; and changing an applied DC voltage to the tunable dielectric layer turns on the transmission switch.

In some embodiments of the present disclosure, changing an applied DC voltage to the tunable dielectric layer comprises applying a first DC voltage to the tunable dielectric layer so as to turn off the transmission switch and applying a second DC voltage to the tunable dielectric layer so as to turn on the transmission switch.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a transmission switch containing tunable dielectrics for transmitting signals and an operating method for the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
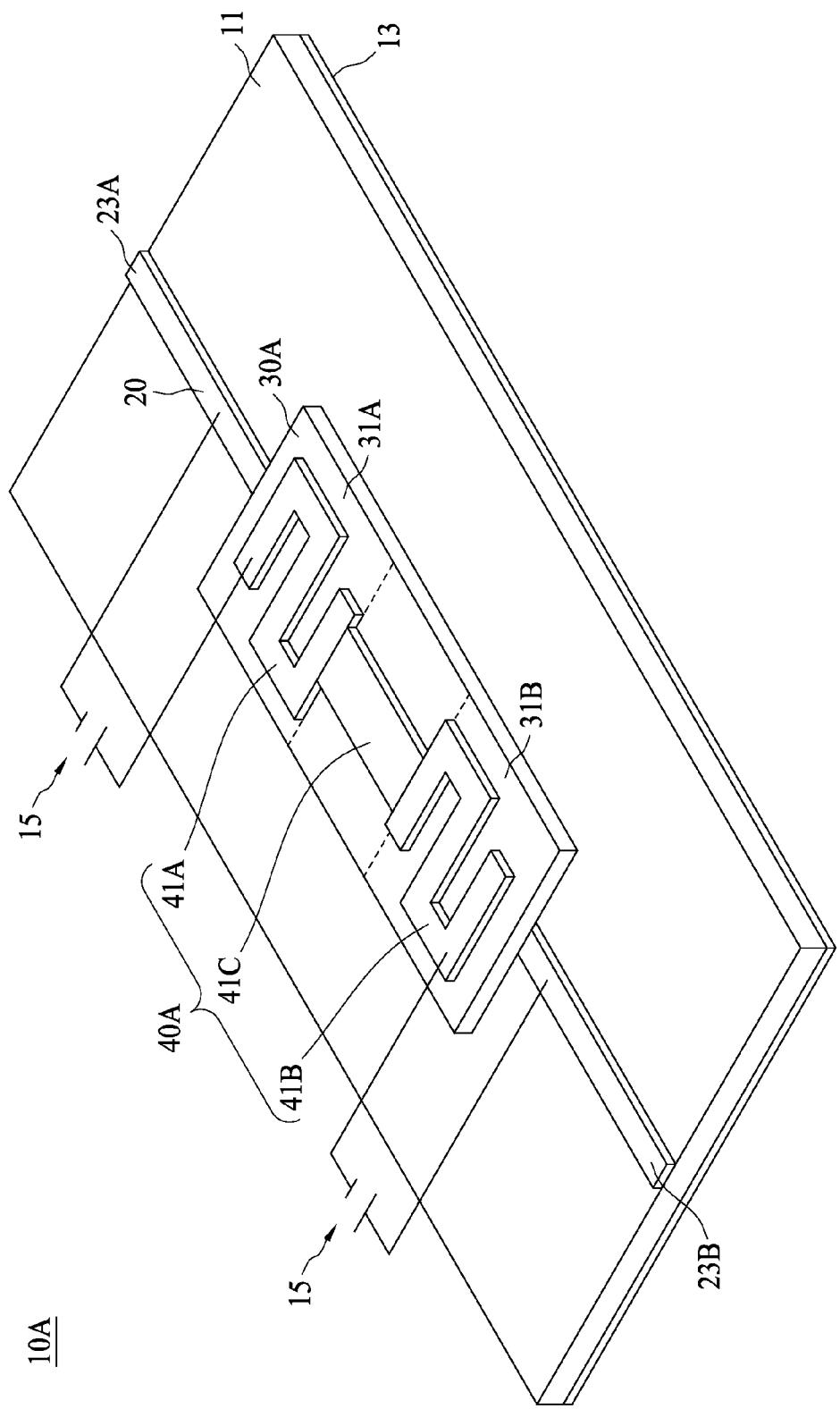
FIG. 1 illustrates a three-dimensional view of a transmission switch according to some embodiments of the present disclosure.
Figure 2:
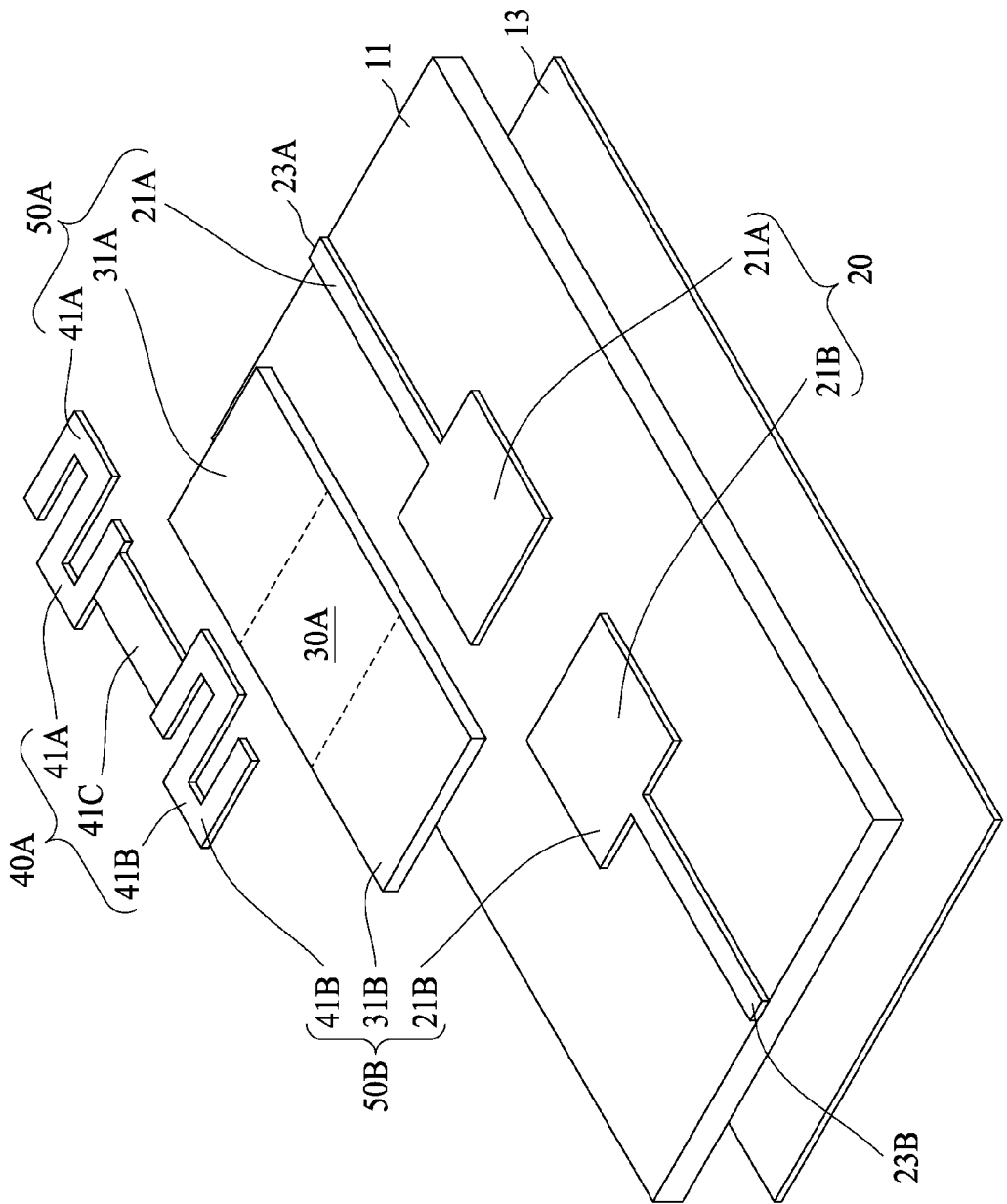
FIG. 2 illustrates a disassembled view of the transmission switch according to some embodiments of the present disclosure.

FIG. 1 illustrates a three-dimensional view of a transmission switch 10A according to some embodiments of the present disclosure and FIG. 2 illustrates a disassembled view of the transmission switch 10A according to some embodiments of the present disclosure. In some embodiments of the present disclosure, the transmission switch 10A comprises a dielectric substrate 11, a bottom conductive layer 13 disposed on a bottom surface of the dielectric substrate 11, a conductive ground layer 20 disposed over an upper surface of the dielectric substrate 11, a tunable dielectric layer 30A disposed over the conductive ground layer 20, and a conductive signal layer 40A disposed over the tunable dielectric layer 30A.

In some embodiments of the present disclosure, the dielectric substrate 11 is a fiberglass substrate, and the bottom conductive layers 13, the conductive ground layer 20, and the conductive signal layer 40A are made of inductors, such as copper. In some embodiments of the present disclosure, the bottom conductive layer 13 substantially covers the bottom surface of the dielectric substrate 11.

In some embodiments of the present disclosure, the conductive ground layer 20 comprises a first ground section 21A and a second ground section 21B separated from the first ground section 21A; the tunable dielectric layer 30A covers a portion of the conductive ground layer 20; and the conductive signal layer 40A comprises a first signal section 41A, a second signal section 41B, and an impedance-matching section 41C connecting the first signal section 41A and the second signal section 41B. In some embodiments of the present disclosure, one end of the first ground section 21A serves as an input terminal 23A of the transmission switch 10A, and one end of the second ground section 21B serves as an output terminal 23B of the transmission switch 10A.

In some embodiments of the present disclosure, the first ground section 21A, a first portion 31A of the tunable dielectric layer 30A, and the first signal section 41A form a first resonant section 50A; and the second ground section 21B, a second portion 31B of the tunable dielectric layer 30A, and the second signal section 41B form a second resonant section 50B.

Figure 3:
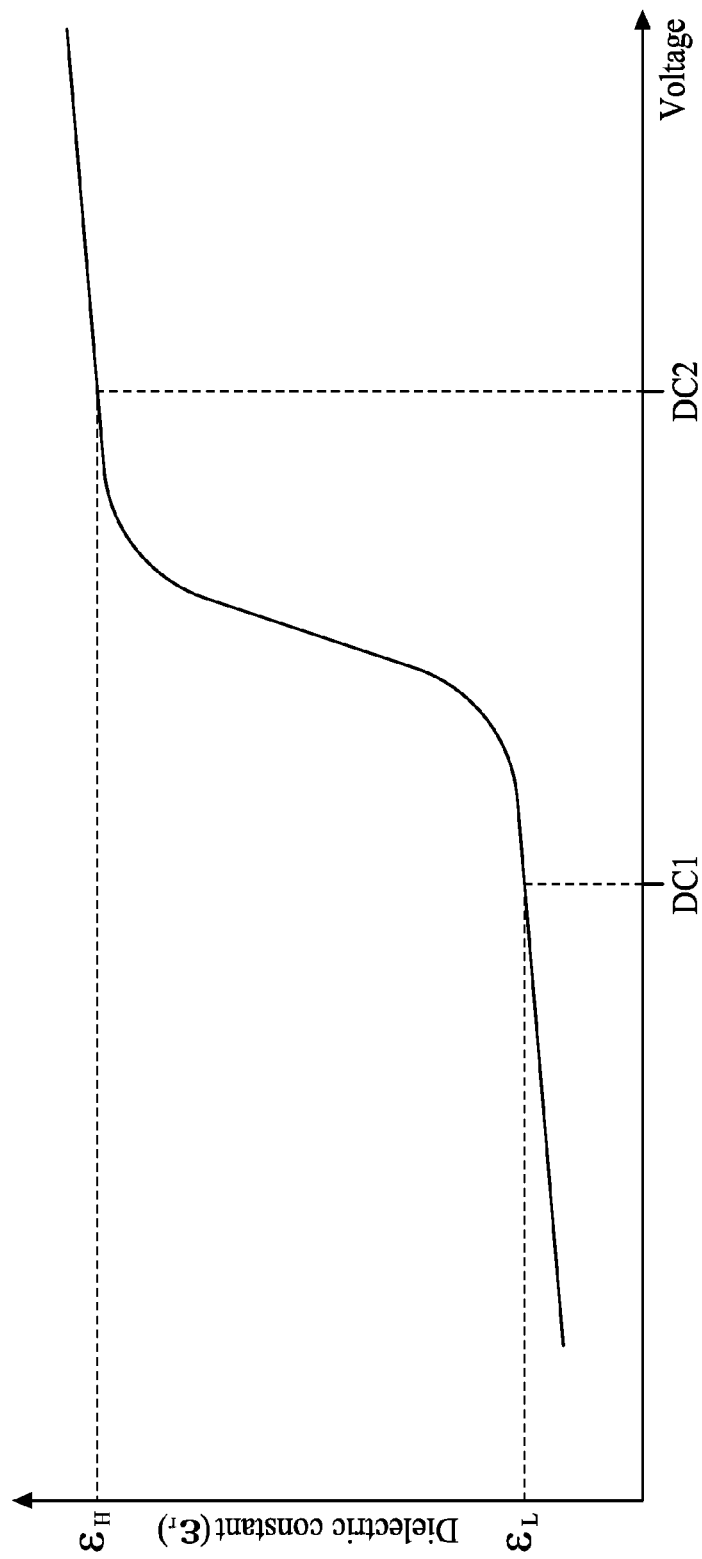
FIG. 3 is a plot showing the variation of the dielectric constant of the tunable dielectric layer with respect to different DC voltages according to some embodiments of the present disclosure.

FIG. 3 is a plot showing the variation of the dielectric constant of the tunable dielectric layer 30A with respect to different DC voltages according to some embodiments of the present disclosure. In some embodiments of the present disclosure, the tunable dielectric layer 30A is composed of liquid crystal such as GT3 series from Merck KGaA, Germany, which has a first dielectric constant ($\varepsilon_L$) at a first DC voltage (DC1) and a second dielectric constant ($\varepsilon_H$) at a second DC voltage (DC2), wherein the first dielectric constant ($\varepsilon_L$) is lower than the second dielectric constant ($\varepsilon_H$). In other words, changing the applied DC voltage to the tunable dielectric layer 30A can alter the dielectric constant of the tunable dielectric layer 30A.

Referring back to FIG. 1, in some embodiments of the present disclosure, the transmission switch 10A further comprises a voltage-applying device 15 configured to apply a DC voltage to the tunable dielectric layer 30A so as to control the dielectric constant of the tunable dielectric layer 30A. In some embodiments of the present disclosure, the voltage-applying device 15 is configured to apply the DC voltage to the tunable dielectric layer 30A through the conductive ground layer 20 and the conductive signal layer 40A.

Figure 4:
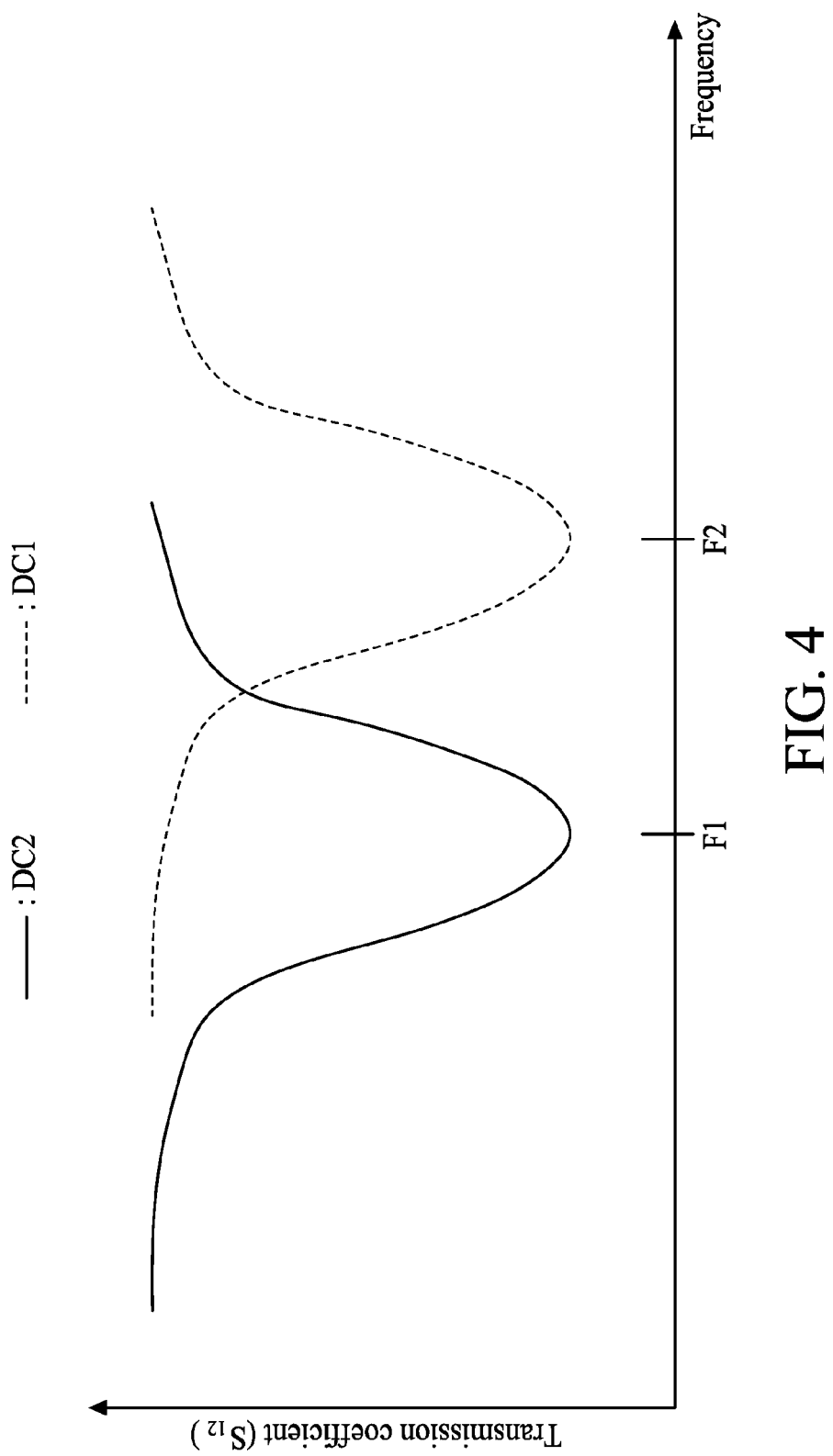
FIG. 4 is a plot showing the variation of the transmission coefficient (i.e. the S parameters) of the transmission switch with respect to the frequency under different voltages according to some embodiments of the present disclosure.

FIG. 4 is a plot showing the variation of the transmission coefficient (i.e. the S parameters) of the transmission switch 10A with respect to the frequency under different voltages according to some embodiments of the present disclosure. In some embodiments of the present disclosure, the first signal section 41A and the second signal section 41B are implemented by conductive lines having an effective electrical length substantially equal to an integral number of half wavelengths at the operating frequency so as to provide a high impedance (an equivalent open circuit) at the node connecting the impedance-matching section 41C. In some embodiments of the present disclosure, the first signal section 41A and the second signal section 41B can be equivalently implemented by electrical elements, including inductors and capacitors connected in parallel or in series, so as to provide high equivalent impedance at the node connecting the impedance-matching section 41C.

In some embodiments of the present disclosure, as the tunable dielectric layer 30A is biased at the first DC voltage DC1, the tunable dielectric layer 30A has a first dielectric constant ($\varepsilon_L$), and the first resonant section 50A and the second resonant section 50B have a low equivalent impedance at the operating frequency; therefore, the first resonant section 50A and the second resonant section 50B can serve as short circuits between the terminals 23A, 23B and the impedance-matching section 41C, respectively. In contrast, as the tunable dielectric layer 30A is biased at the second DC voltage DC2, the tunable dielectric layer 30A has a second dielectric constant ($\varepsilon_H$), and the first resonant section 50A and the second resonant section 50B have a high equivalent impedance at the operating frequency; therefore, the first resonant section 50A and the second resonant section 50B can serve as open circuits between the terminals 23A, 23B and the impedance-matching section 41C, respectively. In other words, changing the applied DC voltage to the tunable dielectric layer 30A can alter the impedance of the first resonant section 50A and the impedance of the second resonant section 50B.

Assuming the transmission switch 10A is designed to operate at the operating frequency (F1), the transmission coefficient of the transmission switch 10A is at a high level for the operating frequency since the tunable dielectric layer 30A is biased at the first DC voltage DC1, i.e., the transmission switch 10A is considered to be at the turn-on state. As the tunable dielectric layer 30A is biased at the second DC voltage DC2, the transmission coefficient of the transmission switch 10A is at a relatively low level for the operating frequency, i.e., the transmission switch 10A is considered to be at the turn-off state. In other words, changing the applied DC voltage to the tunable dielectric layer 30A can alter the transmission property (transmission coefficient) of the transmission switch 10A for the operating frequency.

In addition, as the biasing voltage of the tunable dielectric layer 30A is changed from the first DC voltage DC1 to the second DC voltage DC2, the waveform of the transmission coefficient of the transmission switch 10A shifts with respect to the frequency (i.e., shifting along the lateral axis) such that the transmission coefficient of the transmission switch 10A is at a relatively high level for another frequency (F2) but at a relatively low level for the operating frequency (F1).

Figure 5:
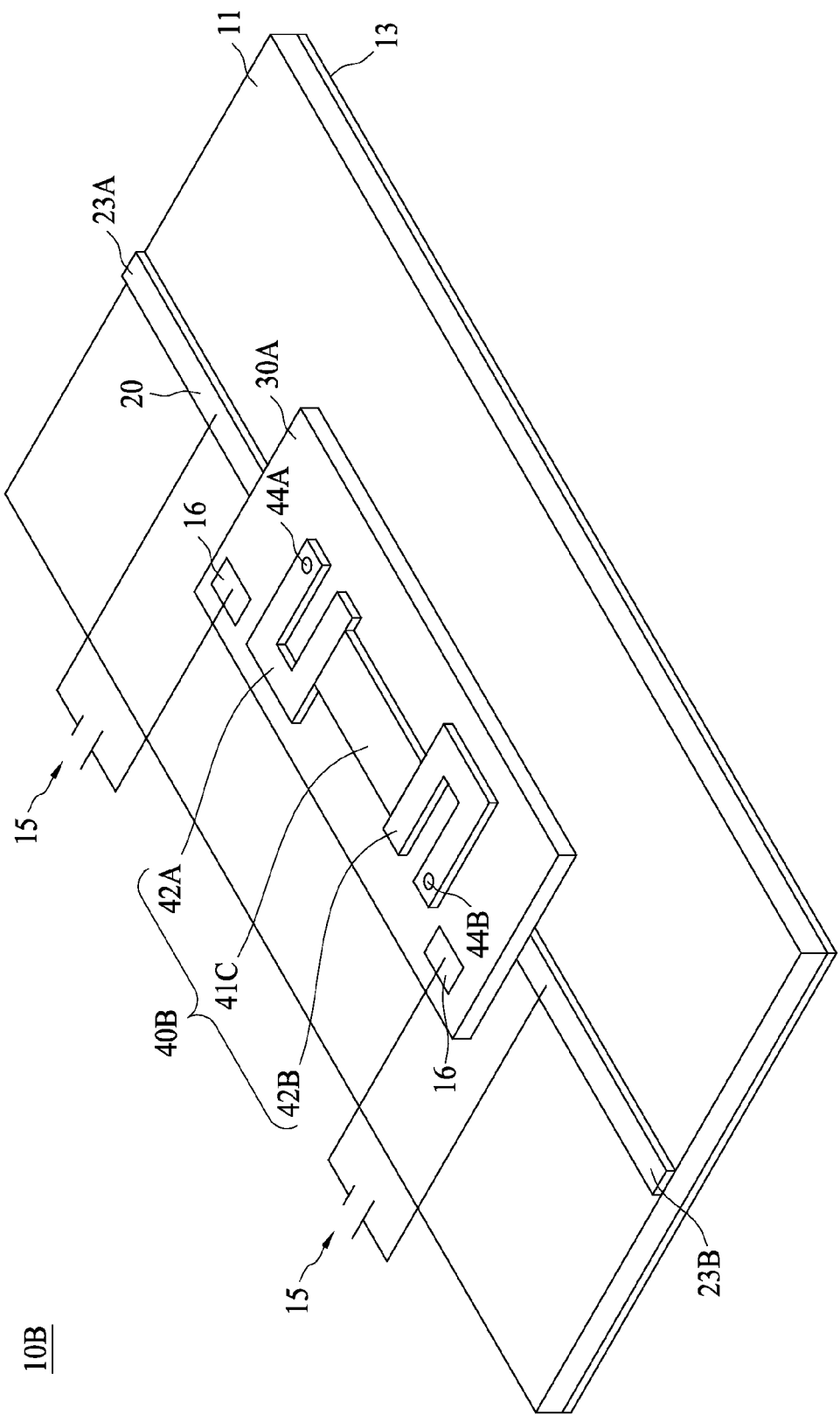
FIG. 5 illustrates a three-dimensional view of a transmission switch according to some embodiments of the present disclosure.
Figure 6:
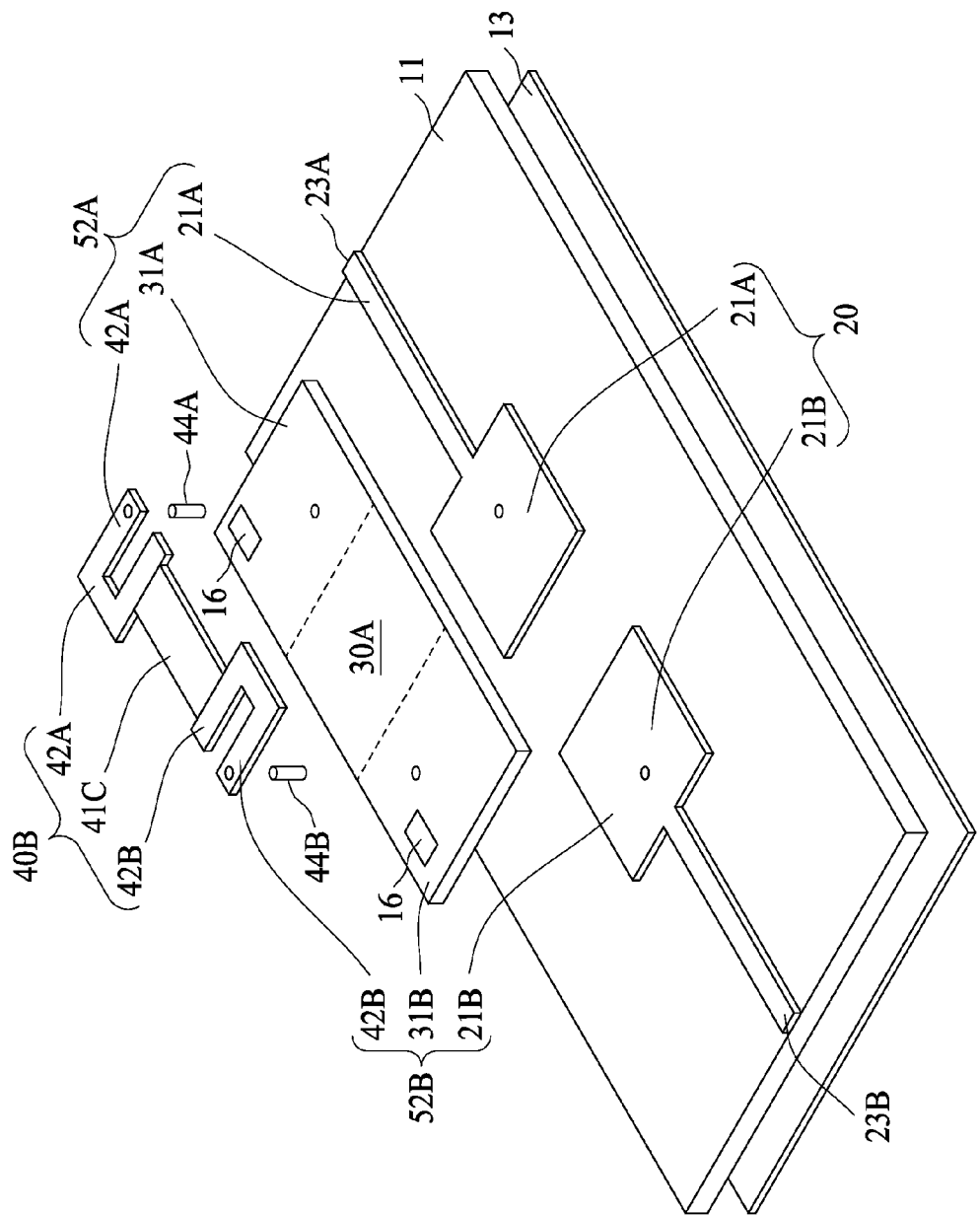
FIG. 6 illustrates a disassembled view of the transmission switch according to some embodiments of the present disclosure.

FIG. 5 illustrates a three-dimensional view of a transmission switch 10B according to some embodiments of the present disclosure and FIG. 6 illustrates a disassembled view of the transmission switch 10B according to some embodiments of the present disclosure. The transmission switch 10B is substantially similar to the transmission switch 10A in FIG. 1, except that the conductive signal layer 40B comprises a first signal section 42A, a second signal section 42B, and an impedance-matching section 41C connecting the first signal section 42A and the second signal section 42B.

In some embodiments of the present disclosure, the first ground section 21A, a first portion 31A of the tunable dielectric layer 30A, and the first signal section 42A form a first resonant section 52A; and the second ground section 21B, a second portion 31B of the tunable dielectric layer 30A, and the second signal section 42B form a second resonant section 52B.

In addition, the transmission switch 10B further comprises a first conductive via 44A electrically connecting the first signal section 42A to the first ground section 21A, and a second conductive via 44B electrically connecting the second signal section 42B to the second ground section 21B. In some embodiments of the present disclosure, the voltage-applying device 15 is configured to apply the DC voltage to the tunable dielectric layer 30A through the conductive ground layer 20 and the conductive pads 16 on the tunable dielectric layer 30A.

In some embodiments of the present disclosure, the first signal section 42A and the second signal section 42B are implemented by conductive lines having an effective electrical length substantially equal to an odd integral number of quarter wavelengths at the operating frequency (F1) so as to provide a high equivalent impedance, which consequently provides a high impedance (an equivalent open circuit) at the node connecting the impedance-matching section 41C. In some embodiments of the present disclosure, the first signal section 42A and the second signal section 42B can be equivalently implemented by electrical elements, including inductors and capacitors connected in parallel or in series, so as to provide high equivalent impedance at the node connecting the impedance-matching section 41C.

In some embodiments of the present disclosure, as the tunable dielectric layer 30A is biased at the first DC voltage DC1, the tunable dielectric layer 30A has a first dielectric constant ($\varepsilon_L$), and the first resonant section 52A and the second resonant section 52B have a low equivalent impedance at the operating frequency; therefore, the first resonant section 52A and the second resonant section 52B can serve as short circuits between the terminals 23A, 23B and the impedance-matching section 41C. In contrast, as the tunable dielectric layer 30A is biased at the second DC voltage DC2, the tunable dielectric layer 30A has a second dielectric constant ($\varepsilon_H$), and the first resonant section 52A and the second resonant section 52B have a high equivalent impedance at the operating frequency; therefore, the first resonant section 52A and the second resonant section 520B can serve as open circuits between the terminals 23A, 23B and the impedance-matching section 41C.

The transmission property of the transmission switch 10B is similar to that shown in FIG. 4. Assuming the transmission switch 10B is designed to operate at the operating frequency (F1), the transmission coefficient of the transmission switch 10B is at a high level for the operating frequency since the tunable dielectric layer 30A is biased at the first DC voltage DC1, i.e., the transmission switch 10B is considered to be at the turn-on state. As the tunable dielectric layer 30A is biased at the second DC voltage DC2, the transmission coefficient of the transmission switch 10B is at a relatively low level for the operating frequency, i.e., the transmission switch 10B is considered to be at the turn-off state.

Figure 7:
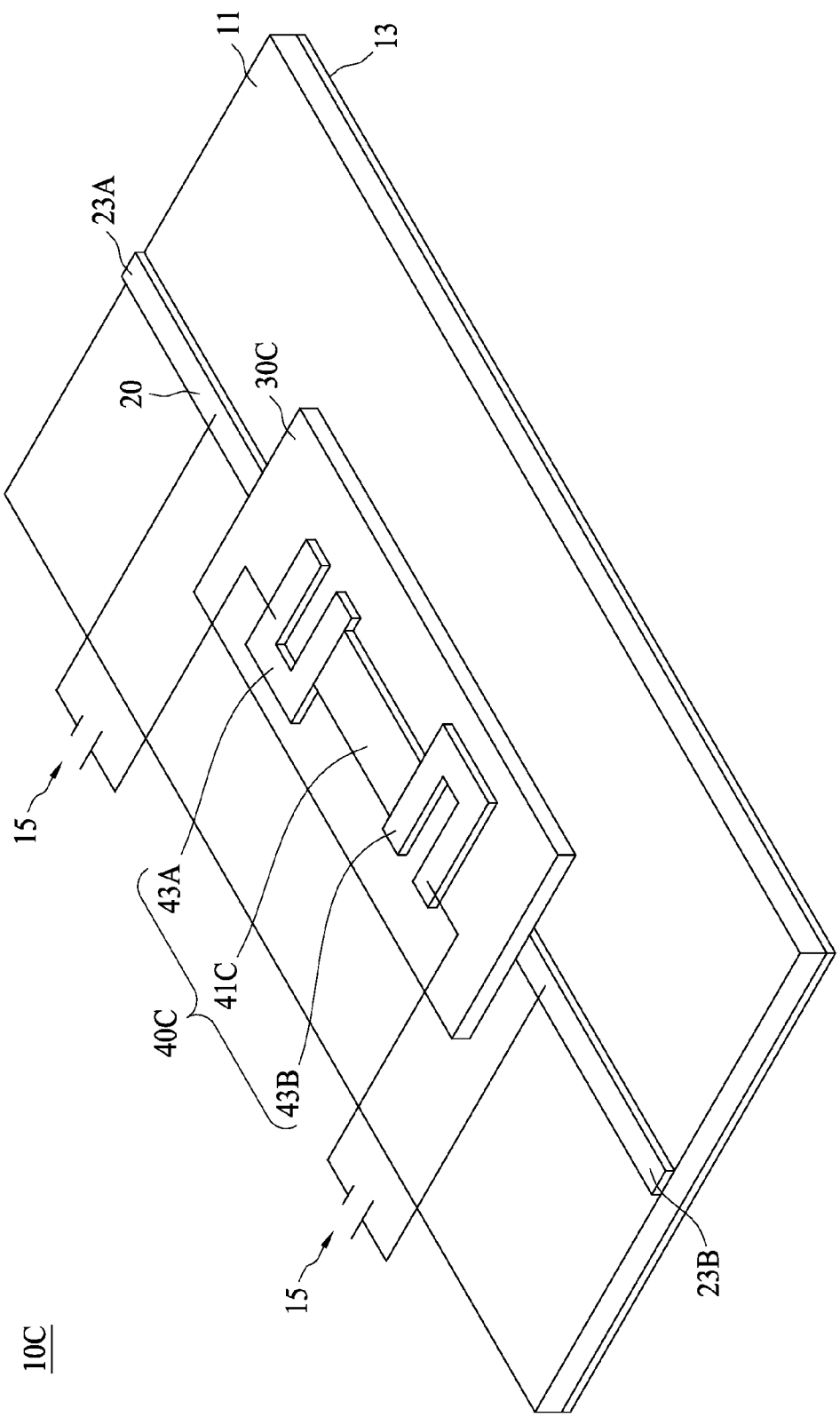
FIG. 7 illustrates a three-dimensional view of a transmission switch according to some embodiments of the present disclosure.
Figure 8:
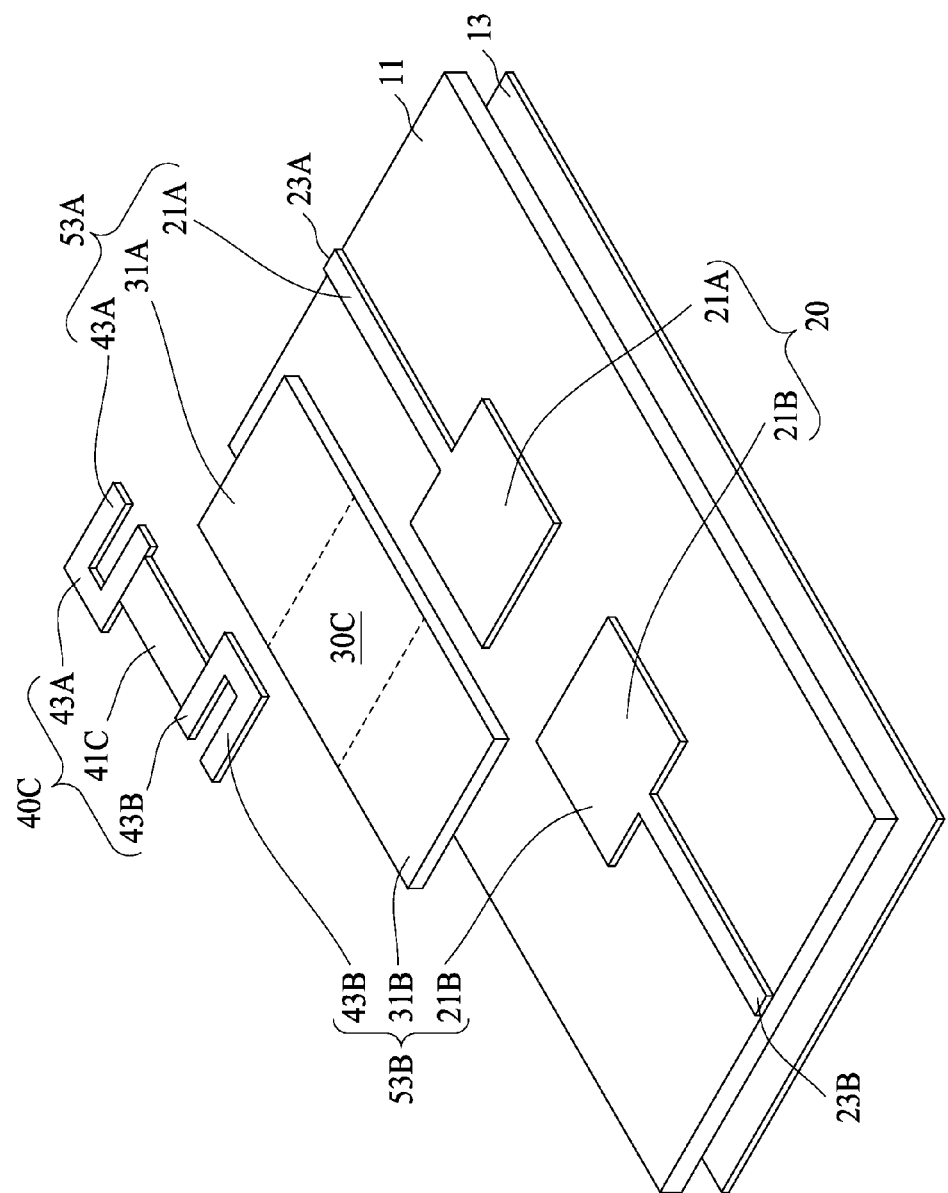
FIG. 8 illustrates a disassembled view of the transmission switch according to some embodiments of the present disclosure.

FIG. 7 illustrates a three-dimensional view of a transmission switch 10C according to some embodiments of the present disclosure and FIG. 8 illustrates a disassembled view of the transmission switch 10C according to some embodiments of the present disclosure. The transmission switch 10C is substantially similar to the transmission switch 10B in FIG. 5, except that the conductive signal layer 40C comprises a first signal section 43A, a second signal section 43B, and an impedance-matching section 41C connecting the first signal section 43A and the second signal section 43B.

Figure 9:
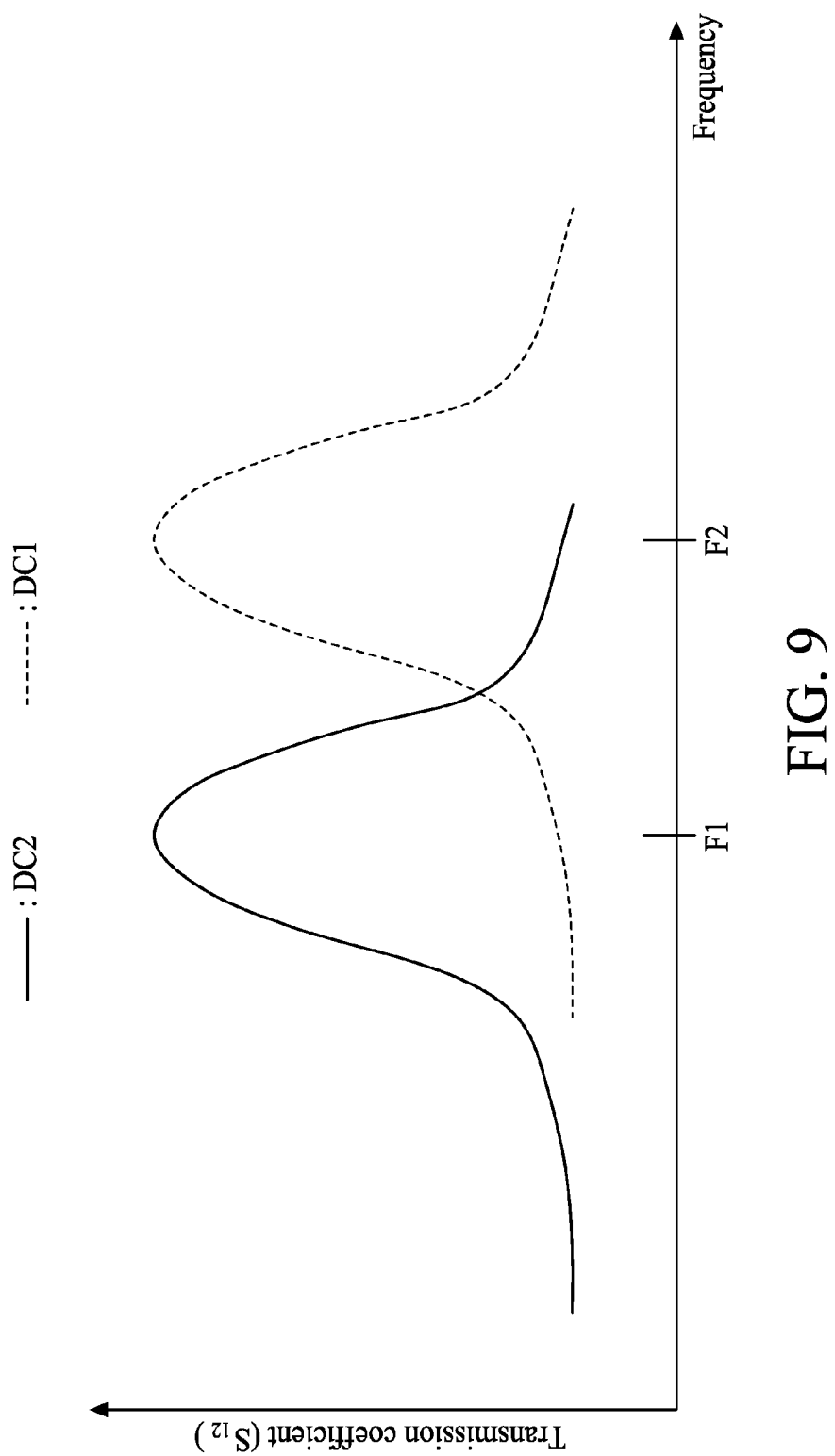
FIG. 9 is a plot showing the variation of the transmission coefficient (i.e. the S parameters) of the transmission switch with respect to the frequency under different voltages according to some embodiments of the present disclosure.

In some embodiments of the present disclosure, the first ground section 21A, a first portion 31A of the tunable dielectric layer 30A, and the first signal section 43A form a first resonant section 53A; and the second ground section 21B, a second portion 31B of the tunable dielectric layer 30A, and the second signal section 43B form a second resonant section 53B. In some embodiments of the present disclosure, the first signal section 43A and the second signal section 43B are conductive lines having an effective electrical length substantially equal to an odd integral number of quarter wavelengths at an operating frequency (F1) so as to provide a low impedance (an equivalent short circuit) at the node connecting the impedance-matching section 41C. In some embodiments of the present disclosure, the first signal section 43A and the second signal section 43B can be equivalently implemented by electrical elements, including inductors and capacitors connected in parallel or in series, so as to provide low equivalent impedance at the node connecting the impedance-matching section 41C FIG. 9 is a plot showing the variation of the transmission coefficient (i.e. the S parameters) of the transmission switch 10C with respect to the frequency under different voltages according to some embodiments of the present disclosure. Assuming the transmission switch 10C is designed to operate at the operating frequency (F1), the transmission coefficient of the transmission switch 10C is at a low level for the operating frequency since the tunable dielectric layer 30C is biased at the first DC voltage DC1, i.e., the transmission switch 10C is at the turn-off state. As the tunable dielectric layer 30C is biased at the second DC voltage DC2, the transmission coefficient of the transmission switch 10C is at a relatively high level for the operating frequency, i.e., the transmission switch 10C is at the turn-on state.

In addition, as the biasing voltage of the tunable dielectric layer 30C is changed from the first DC voltage DC1 to the second DC voltage DC2, the waveform of the transmission coefficient of the transmission switch 10C shifts along the lateral axis, such that the transmission coefficient of the transmission switch 10C is at a relatively low level for another frequency (F2) but at a relatively high level for the operating frequency (F1).

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A transmission switch, comprising:
a dielectric substrate;
a conductive ground layer disposed over an upper surface of the dielectric substrate, wherein the conductive ground layer comprises a first ground section and a second ground section separated from the first ground section;
a tunable dielectric layer disposed over the conductive ground layer, wherein the tunable dielectric layer has a first dielectric constant at a first DC voltage and a second dielectric constant at a second DC voltage; and
a conductive signal layer disposed over the tunable dielectric layer, wherein the conductive signal layer comprises a first signal section, a second signal section, and an impedance-matching section connecting the first signal section and the second signal section.

2. The transmission switch of claim 1, further comprising a bottom conductive layer disposed on a bottom surface of the dielectric substrate.

3. The transmission switch of claim 1, further comprising a voltage-applying device configured to apply a DC voltage to the tunable dielectric layer so as to control the dielectric constant of the tunable dielectric layer.

4. The transmission switch of claim 3, wherein the voltage-applying device is configured to apply the DC voltage to the tunable dielectric layer through the conductive ground layer and the conductive signal layer.

5. The transmission switch of claim 1, wherein the first ground section, the tunable dielectric layer, and the first signal section form a first resonant section; and the second ground section, the tunable dielectric layer, and the second signal section form a second resonant section.

6. The transmission switch of claim 5, wherein the first signal section and the second signal section are conductive lines having an effective electrical length substantially equal to an integral number of half wavelengths at an operating frequency, and the transmission switch is at a turn-off state at the operating frequency.

7. The transmission switch of claim 5, wherein the first signal section and the second signal section have an effective electrical length substantially equal to an odd integral number of quarter wavelengths at an operating frequency, and the transmission switch is at a turn-off state at the operating frequency.

8. The transmission switch of claim 7, further comprising a first conductive via electrically connecting the first signal section to the first ground section, and a second conductive via electrically connecting the second signal section to the second ground section.

9. The transmission switch of claim 5, wherein the first signal section and the second signal section have an effective electrical length substantially equal to an odd integral number of quarter wavelengths at an operating frequency, and the transmission switch is at a turn-on state at the operating frequency.

10. An operating method of a transmission switch comprising a conductive ground layer, a conductive signal layer, and a tunable dielectric layer between the conductive ground layer and the conductive signal layer; wherein the operating method comprises changing an applied DC voltage to the tunable dielectric layer so as to alter a transmission property of the transmission switch;
wherein the transmission switch comprises a first resonant section, a second resonant section, and an impedance-matching section connecting the first resonant section and the second resonant section; and changing an applied DC voltage to tunable dielectric layer alters a first impedance of the first resonant section and a second impedance of the second resonant section.

11. The operating method of a transmission switch of claim 10, wherein changing an applied DC voltage to the tunable dielectric layer is performed through the conductive ground layer and the conductive signal layer.

12. The operating method of a transmission switch of claim 10, wherein changing an applied DC voltage to the tunable dielectric layer alters a dielectric constant of the tunable dielectric layer.

13. The operating method of a transmission switch of claim 10, wherein the first resonant section and the second resonant section serve as open circuits at an operating frequency; and changing an applied DC voltage to the tunable dielectric layer turns off the transmission switch.

14. The operating method of a transmission switch of claim 10, wherein the first resonant section and the second resonant section serve as short circuits at an operating frequency; and changing an applied DC voltage to the tunable dielectric layer turns on the transmission switch.

15. The operating method of a transmission switch of claim 12, wherein changing an applied DC voltage to the tunable dielectric layer comprises applying a first DC voltage to the tunable dielectric layer so as to turn off the transmission switch and applying a second DC voltage to the tunable dielectric layer so as to turn on the transmission switch.

* * * * *